United States Patent
Hamerski et al.

(10) Patent No.: US 7,847,315 B2
(45) Date of Patent: Dec. 7, 2010

(54) HIGH EFFICIENCY RECTIFIER

(75) Inventors: Roman J. Hamerski, Overland Park, KS (US); Zerui Chen, Burnaby (CA); James Man-Fai Hong, San Leandro, CA (US); Johnny Duc Van Chiem, Camarillo, CA (US); Christopher D. Hruska, Blue Springs, MO (US); Timothy Eastman, Lee's Summit, MO (US)

(73) Assignee: Diodes Fabtech Inc., Lee's Summit, MO (US)

( * ) Notice: Subject to any disclaimer, the term of this patent is extended or adjusted under 35 U.S.C. 154(b) by 599 days.

(21) Appl. No.: 11/684,261

(22) Filed: Mar. 9, 2007

(65) Prior Publication Data

US 2008/0217721 A1 Sep. 11, 2008

(51) Int. Cl.
*H01L 29/36* (2006.01)
*H01L 29/86* (2006.01)

(52) U.S. Cl. .................. 257/109; 257/155; 257/156; 257/E29.11; 257/E29.325

(58) Field of Classification Search ......... 257/104–106, 257/329, 335, 341, 345, 475, E21.358, 109, 257/155, 156, E29.11, E29.325
See application file for complete search history.

(56) References Cited

U.S. PATENT DOCUMENTS

| 4,149,174 | A | * | 4/1979 | Shannon | 257/29 |
|---|---|---|---|---|---|
| 4,692,348 | A | * | 9/1987 | Rubloff et al. | 438/558 |
| 5,182,222 | A | * | 1/1993 | Malhi et al. | 438/273 |
| 5,818,084 | A | | 10/1998 | Williams | |
| 6,979,861 | B2 | | 12/2005 | Rudov | |
| 7,417,266 | B1 | * | 8/2008 | Li et al. | 257/135 |

OTHER PUBLICATIONS

S. P. Murarka "Silicide for VLSI Applications" by Academic Press, 1983, p. 167.

* cited by examiner

*Primary Examiner*—Jerome Jackson, Jr.
*Assistant Examiner*—Yu Chen
(74) *Attorney, Agent, or Firm*—Spencer Fane Britt & Browne LLP

(57) ABSTRACT

A high-efficiency power semiconductor rectifier device (10) comprising a δP++ layer (12), a P-body (14), an N-drift region (16), an N+ substrate (18), an anode (20), and a cathode (22). The method of fabricating the device (10) comprises the steps of depositing the N-drift region (16) on the N+ substrate (18), implanting boron into the N-drift region (16) to create a P-body region (14), forming a layer of titanium silicide (56) on the P-body region (14), and concentrating a portion of the implanted boron at the interface region between the layer of titanium silicide (56) and the P-body region (14) to create the δP++ layer (12) of supersaturated P-doped silicon.

4 Claims, 11 Drawing Sheets

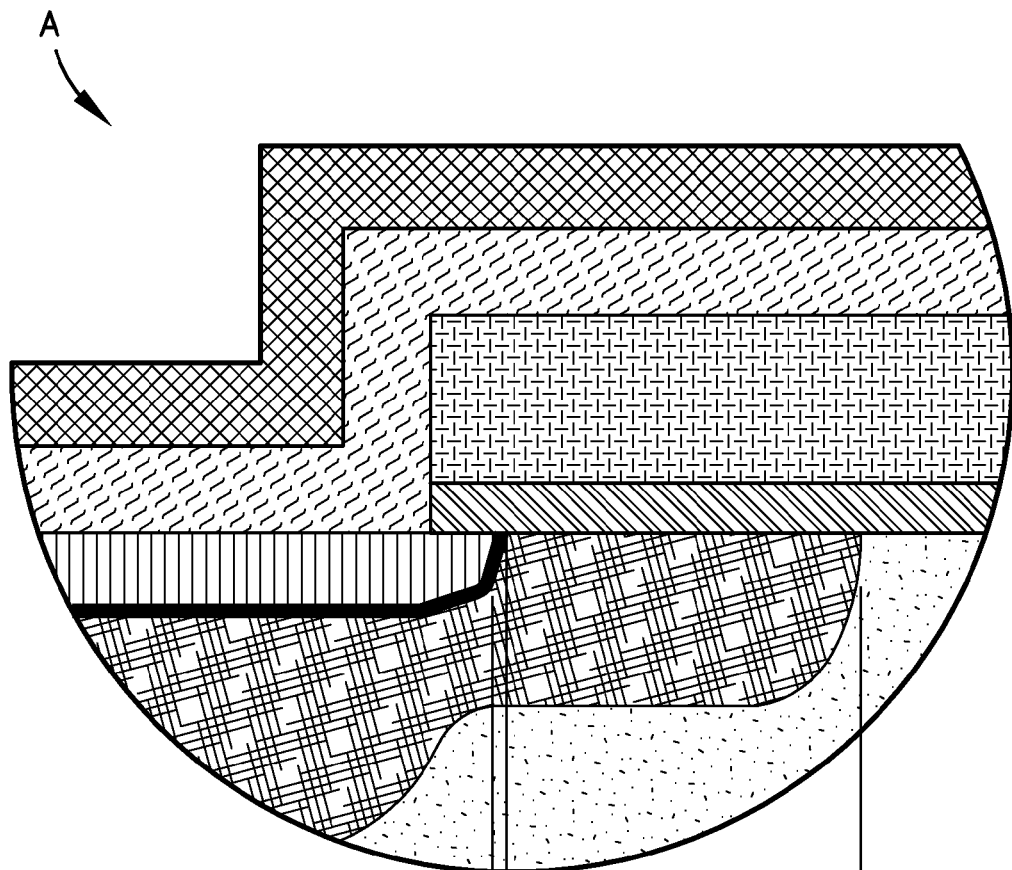
*Fig. 3*
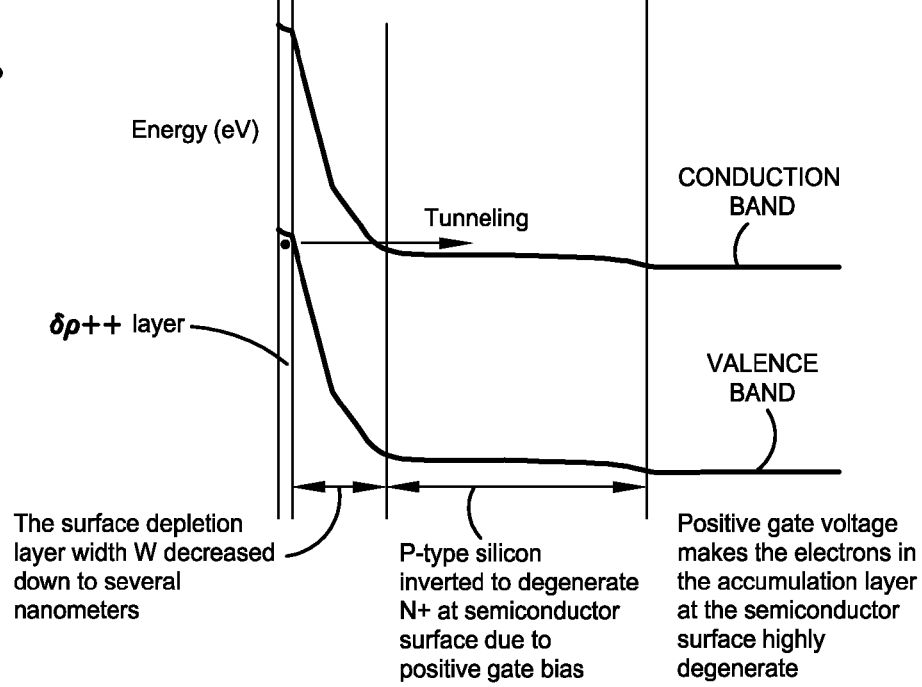

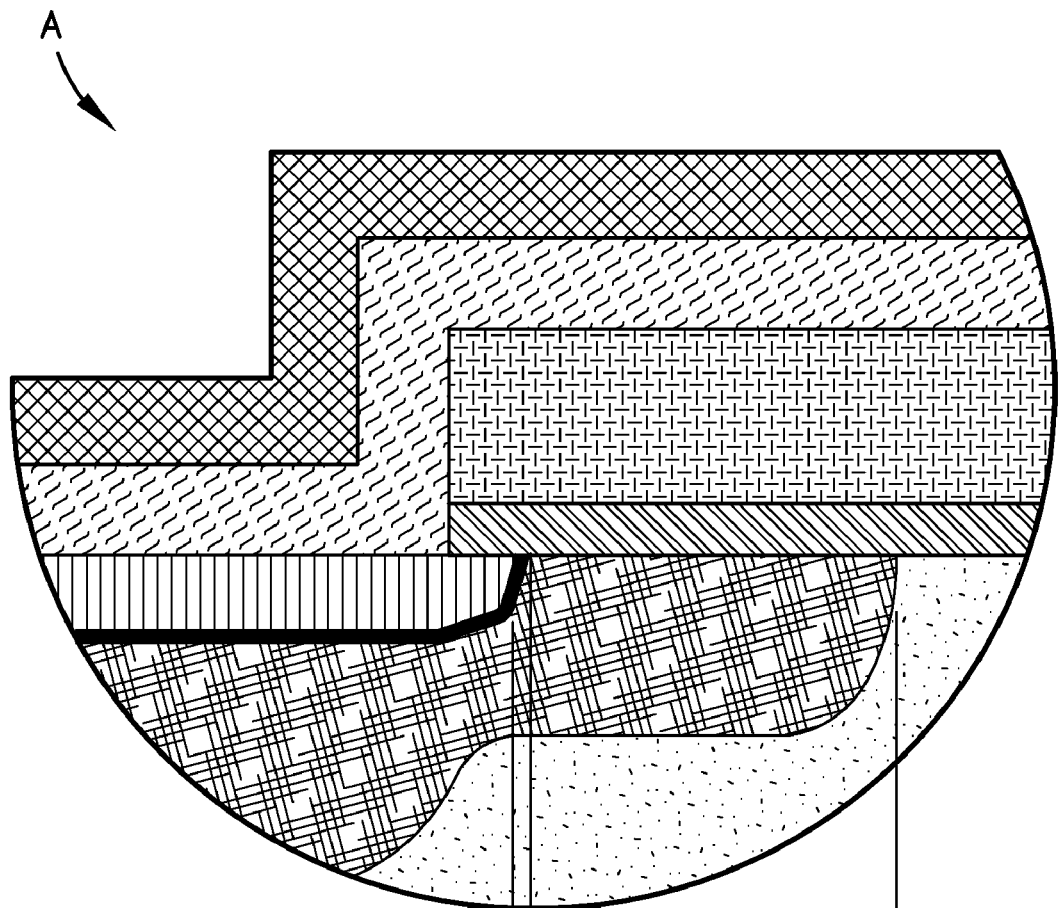
*Fig. 4*
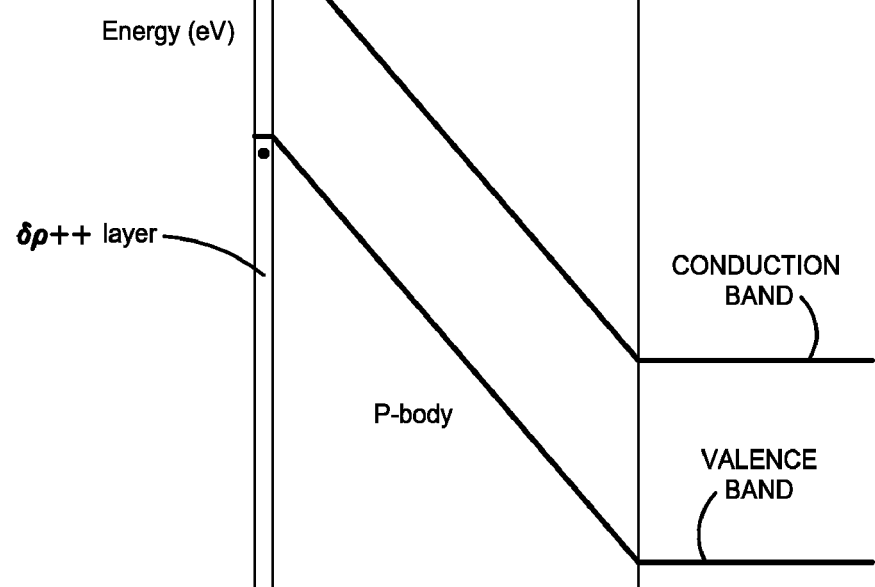

US 7,847,315 B2

HIGH EFFICIENCY RECTIFIER

FIELD OF THE INVENTION

The present invention relates to semiconductor devices and methods of making same. More specifically, the present invention relates to a power semiconductor rectifier device and a method of making same.

BACKGROUND OF THE INVENTION

Modern power circuits require power rectifiers with improved power switching performance. For high voltage applications, P+/N rectifiers with high switching speeds are often used when high breakdown voltages and high operating temperatures are desired. For low voltage applications, Schottky barrier rectifiers are often used when high switching speeds and very low forward voltage drops are desired. The Schottky barrier rectifier is a majority carrier device which allows little reverse current flow during recovery. Unfortunately, Schottky barrier rectifiers suffer from undesirably high reverse leakage current when operating at elevated temperatures.

Several modifications have been introduced to improve the blocking capability of Schottky rectifiers. One such improvement is the junction barrier Schottky (JBS) rectifier, which combines a P/N junction grid with Schottky barrier regions small enough that the expanding space charge region from the P+/N junction grid leads to elimination of the Schottky barrier lowering caused by the image charge. The JBS rectifier provides an approximately 50% net reduction in leakage current for the same chip area and forward voltage drop. This equates to an approximately 11 degrees Kelvin improvement in the power dissipation curve for a diode operating at a 50% duty cycle.

Another such improvement is trench Schottky, which is useful for higher voltage applications in which the forward voltage drop exceeds 0.7 volts and the JBS rectifier ceases to operate as a majority carrier device. For example, the trench MOS barrier-controlled Schottky (MBS) rectifier has a lower forward voltage drop than the P-i-N rectifier for breakdown voltages up to 250V and still operates as a majority carrier device.

In addition to these high voltage applications, there is an increasing demand for low voltage applications, for which conventional trench Schottky is not well suited. Trench Schottky requires that, in the blocking state, the inner trenches are sufficiently closely spaced, and the adjacent areas of the body portion are sufficiently lowly doped, that the depletion layer formed in the body portion depletes the intermediate areas of the body portion between the trenches at a smaller voltage than the breakdown voltage. In that way, the reverse voltage blocking characteristic is improved. Unfortunately, it also results in a significant reduction in the area available for the Schottky barrier because the trench may consume as much as 50% of the area available on the chip.

U.S. Pat. No. 6,979,861 discloses a MOS transistor-like two terminal device. The vertical structure and forward current flow pattern of this device are shown in FIG. 2 of the patent. The device is a two-terminal device; the upper electrode provides direct contact with an N+ source, a gate electrode, and a P-body, while the lower electrode is a drain electrode. Forward conduction is achieved when positive voltage is applied to the top electrode. Positive bias on the gate inverts the P-body under the gate into an N-channel which allows forward current to flow. Negative bias on the gate does not cause the N-channel to form. The P-base/N-drift region becomes reverse-biased pin diode and supports a reverse voltage. Unfortunately, this device suffers from its parasitic N+/P/N bipolar structure resulting in reduced dV/dt performance.

SUMMARY OF THE INVENTION

The present invention overcomes the above-discussed problems and limitations by providing an improved semiconductor rectifier device. Broadly characterized, the device comprises a layer of silicon which has been supersaturated with a dopant of a first conductivity type, a body region of the first conductivity type located substantially below and adjacent to the layer of supersaturated silicon, a drift region of a second conductivity type located substantially below and adjacent to the body region, and a substrate of the second conductivity type located substantially below the drift region.

Broadly characterized, the method of fabricating the aforementioned device comprises the steps of depositing the drift region of the second conductivity type on the substrate of the second conductivity type, implanting the dopant of the first conductivity type into the drift region to create the body region of the first conductivity type, forming a layer of higher order silicide, e.g., titanium silicide, on the body region, and concentrating a portion of the implanted dopant at the interface region between the layer of silicide and body region to create the layer of silicon which has been supersaturated with the dopant of the first conductivity type.

In one embodiment, the first conductivity type is P and the second conductivity type is N. Thus, in this embodiment, the device broadly comprises a δP++ layer, a P-body, an N-drift region, an N+ substrate, an anode, and a cathode. In this embodiment, the P-body is located substantially below and adjacent to the δP++ layer, the N-drift region is located substantially below and adjacent to the P-body, the N+ substrate is located substantially below the N-drift region, the anode is located substantially above the a δP++ layer, and the cathode is located substantially below the N+ substrate.

Thus, in this embodiment, the method of fabricating the device comprises the steps of depositing the N-drift region on the N+ substrate, implanting boron into the N-drift region to create the P-body region, forming the layer of titanium silicide on the P-body region, and concentrating a portion of the implanted boron at the interface region between the layer of titanium silicide and the P-body region to create the δP++ layer of supersaturated P-doped silicon.

These and other features of the present invention are discussed in detail below in the section titled DETAILED DESCRIPTION OF THE INVENTION.

BRIEF DESCRIPTION OF THE DRAWING FIGURES

The present invention is described herein with reference to the following drawing figures, with greater emphasis being placed on clarity rather than scale:

FIG. 3 is a fragmentary sectional elevation view of area A of the diode of FIG. 1, wherein the device is forward biased;

FIG. 4 is a fragmentary sectional elevation view of area A of the diode of FIG. 1, wherein the device is reverse biased;

DETAILED DESCRIPTION OF THE INVENTION

Figure 1:
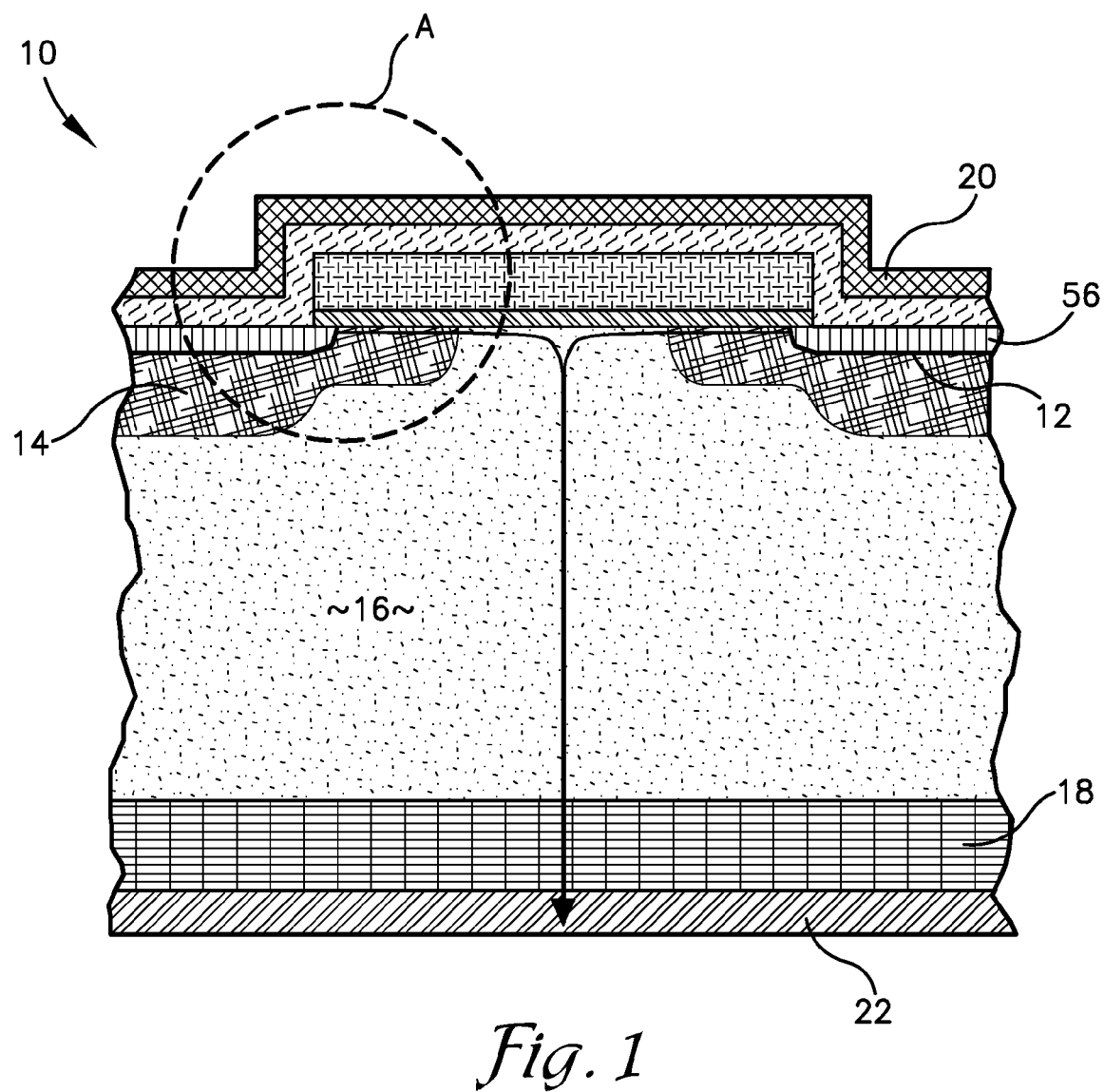
FIG. 1 is a fragmentary sectional elevation view of an embodiment of the device of the present invention.

With reference to the drawings figures, a high efficiency power semiconductor rectifier device 10 is herein described, shown, and otherwise disclosed in accordance with various embodiments, including a preferred embodiment, of the present invention.

Broadly characterized, the device 10 comprises a layer of silicon which has been supersaturated with a dopant of a first conductivity type, a body region of the first conductivity type located substantially adjacent to the layer of supersaturated silicon, a drift region of a second conductivity type located substantially adjacent to the body region, and a substrate of the second conductivity type located below the drift region.

In one embodiment, the first conductivity type is P and the second conductivity type is N. Thus, in this embodiment, referring to FIGS. 1-4, the device 10 broadly comprises a δP++ layer 12, a P-body 14, an N-drift region 16, an N+ substrate 18, an anode 20, and a cathode 22. In this embodiment, the P-body 14 is located substantially adjacent to the δP++ layer 12, the N-drift region 16 is located substantially adjacent to the P-body 14, the N+ substrate 18 is located below the N-drift region, the anode 20 is located above the a δP++ layer 12, and the cathode 22 is located below the n+ substrate 18. As used herein, the term "substantially", when combined with a location term, e.g., above, below, or adjacent, refers to the relative positioning of the aforementioned components and allows for both (A) complex shapes, in which at least the majority portions of the components comport with the described relative positions, and (B) intervening components, e.g., regions or layers, particularly intervening minor components such as interface regions which may have slightly different properties due to fabrication processes and/ or interactions between components. Also as used herein, the terms "above" and "below" refer to respective sides of a component, i.e., "above" refers to one side of the component, and "below" refers to the opposite side of the component. Generally, anything in the relative direction of the anode 20 is "above", while anything in the relative direction of the cathode 22 is "below". But note: "above" and "below" are, as used herein, subjectively defined and not dependent on any particular orientation of the device 10 as a whole.

In one embodiment, the δP++ layer 12 is a supersaturated region of P-doped silicon and has a thickness of approximately several atomic layers; the P-body 14 is a region of boron-implanted polysilicon; the N-drift region 16 has a resistivity of approximately 0.4 Ohms per centimeter and a thickness of approximately 3 micrometers; and the N+ substrate 18 has a resistivity approximately equal to or less than $5 \times 10^{-3}$ Ohms per centimeter, and is doped with arsenic or phosphorous.

In one embodiment, the device 10 further includes the following additional components. A region of titanium silicide 56, or another high order silicide, located above and substantially adjacent to the δP++ layer 12. A layer of silicon oxide 36 functioning as a gate dielectric located above and substantially adjacent to one or more of the N-drift region 16, P-body 14, δP++ layer 12, and region of titanium silicide 56. In one embodiment, the gate oxide 36 has a thickness of approximately 85 Å. A layer of polysilicon 38 located above and substantially adjacent to the layer of silicon oxide 36. In one embodiment, the polysilicon layer 38 is implanted with arsenic at a dose of approximately 8e15 cm-2 and an energy of approximately 40 keV. A layer of titanium 52 located above and substantially adjacent to the layer of polysilicon 38. In one embodiment, the titanium 52 has a thickness of 300 Å. A layer of titanium nitride 54 located above and substantially adjacent to the layer of titanium 52, and below and substantially adjacent to the anode 20. In one embodiment, the titanium nitride 54 has a thickness of 500 Å.

Without a gate voltage, the device 10 acts as a pin diode. Application of a positive gate voltage results in a two-dimensional electron channel under the gate dielectric and the formation of a tunneling δP+/N+ junction.

Figure 2:
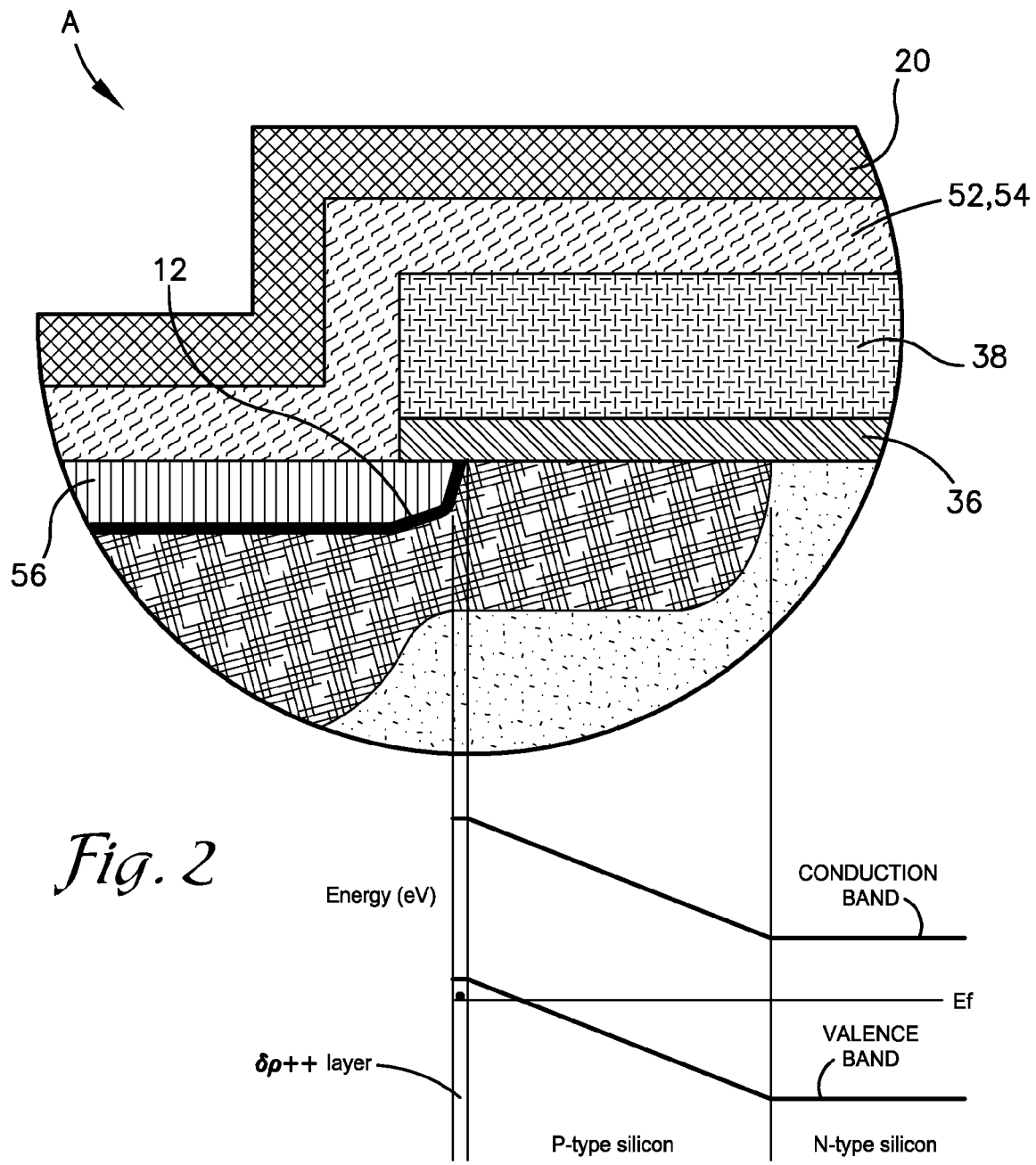
FIG. 2 is a fragmentary sectional elevation view of area A of the device of FIG. 1, wherein the device is in thermal equilibrium.

Application of a positive bias to the δP++ layer 12 results in a large forward current flow due to band-to-band tunneling. FIG. 2 shows the band diagram for the device 10 in thermal equilibrium, while FIG. 3 shows the band diagram for the device's semiconductor surface wherein electron current flows from a two-dimensional MOSFET channel into the three-dimensional δP++ layer 12. Application of a higher forward bias results in increased forward current due to the trap-assisted tunneling current.

Application of a reverse bias results in a negative gate bias, in the surface of the P-body 14 ceasing to be inverted, and in the device 10 acting as a P-i-N diode. FIG. 4 shows the band diagram for the device's semiconductor surface for a reverse-biased diode. Application of higher reverse bias results in the surface of the P-body 14 becoming more accumulated, which, in turn, results in low reverse leakage current.

Broadly characterized, the method of fabricating the device 10 comprises the steps of depositing the drift region of the second conductivity type on the substrate of the second conductivity type, implanting the dopant of the first conductivity type into the drift region to create the body region of the first conductivity type, forming the layer of higher order silicide, e.g., titanium silicide, on the body region, and concentrating a portion of the implanted dopant at the interface region between the layer of silicide and body region to create the layer of silicon which has been supersaturated with the dopant of the first conductivity type.

As mentioned, in one embodiment, the first conductivity type is P and the second conductivity type is N. Thus, in this embodiment, the method comprises the steps of depositing the N-drift region on the N+ substrate, implanting boron into the N-drift region to create a P-body region, forming a layer of titanium silicide on the P-body region, and concentrating a portion of the implanted boron at the interface region between the layer of titanium silicide and the P-body region to create the δP++ layer of supersaturated P-doped silicon.

In one embodiment, referring to FIGS. 5-20, the device 10 is fabricated according to the following detailed steps.

Figure 5:
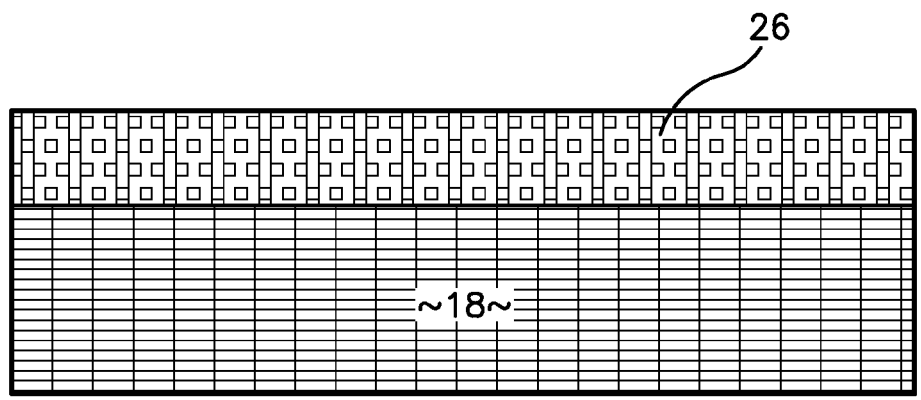
FIG. 5 is a fragmentary sectional elevation view of the device following a first step in an embodiment of a method of fabricating the device.

Step 1: As shown in FIG. 5, an N-layer 26, which will be the N-drift region 16, is epitaxially deposited on the silicon N+ substrate 18.

Figure 6:
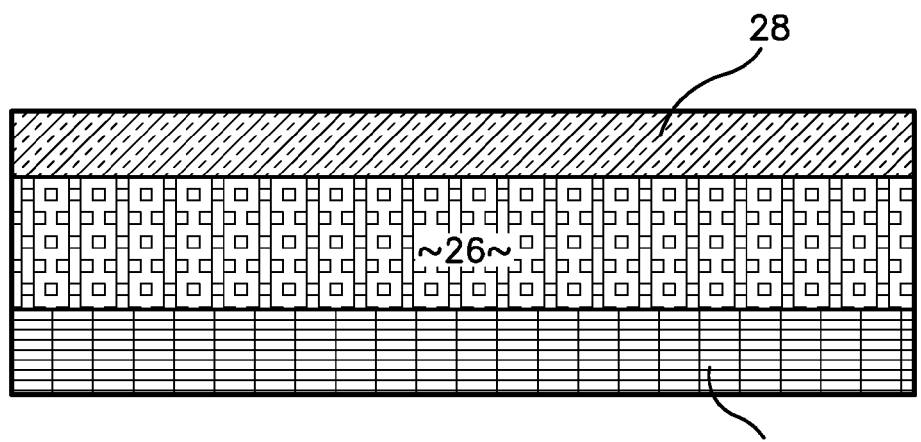
FIG. 6 is a fragmentary sectional elevation view of the device following a second step.

Step 2: As shown in FIG. 6, an initial silicon oxide layer 28 is grown over the N-layer. In one embodiment, the silicon oxide layer 28 has a thickness of approximately 0.75 micrometers; in another embodiment the thickness is approximately between 0.5 micrometers and 1.0 micrometers.

Figure 7:
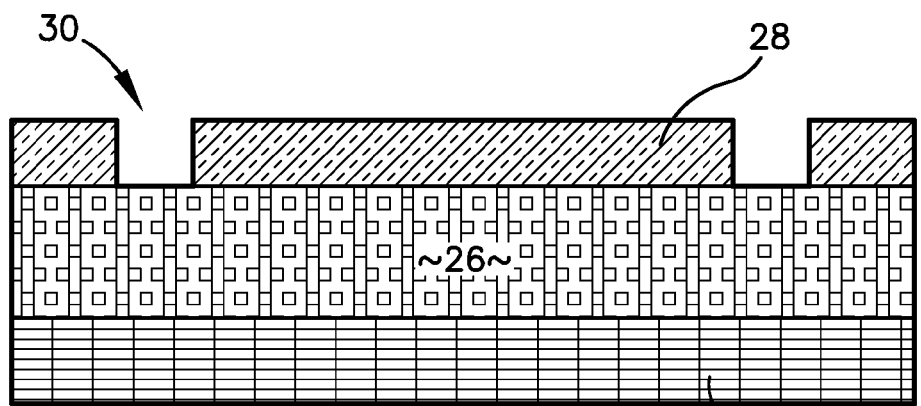
FIG. 7 is a fragmentary sectional elevation view of the device following a third step.

Step 3: As shown in FIG. 7, a guard ring 30 is defined in a first photolithography step by etching, or removing a portion of, the silicon oxide 28. The photoresist used in the photolithography step is then stripped. For diodes having relatively low breakdown voltages of 40V or less, this step, and the resulting P+ guard ring, can be eliminated. Furthermore, a deep boron implant and a shallow boron implant are sufficient to terminate the periphery of the active area along the open area 34 created in Step 6. This simplification can be achieved by overlapping the periphery of the open area 34 created by the second photolithography step of Step 6 with the open area created by the third photolithography step of step 11.

Step 4: Boron is implanted into the guard ring 30 to create a boron implanted region 32. The ranges for the dose and energy for the boron implant 30 can be very wide. In one embodiment, the dose for the boron implant 30 is approximately 3e13 cm-2 and an energy of approximately 30 keV. In one embodiment involving a relatively low breakdown voltage, e.g., approximately equal to or less than 40 V, this boron implantation, as well as subsequent actions on it, can be eliminated.

Figure 8:
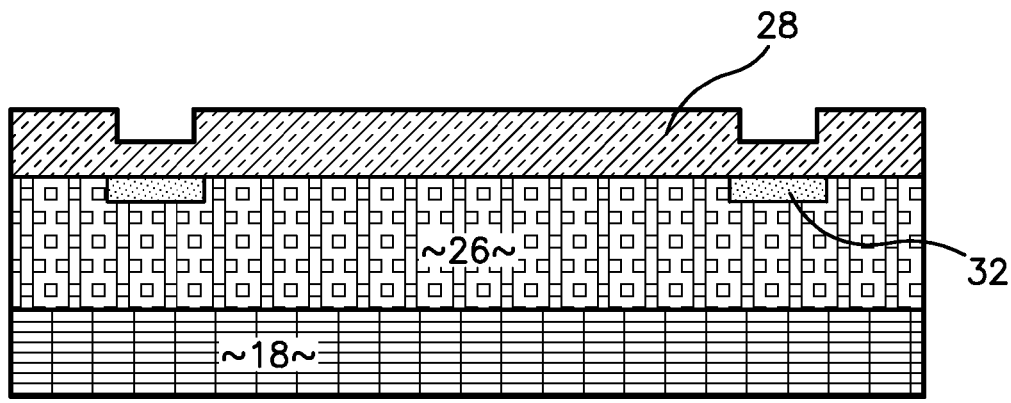
FIG. 8 is a fragmentary sectional elevation view of the device following a fifth step.

Step 5: As shown in FIG. 8, the boron implant 30 is diffused and a thin silicon oxide layer is regrown over the boron-implanted silicon to provide for edge termination.

Figure 9:
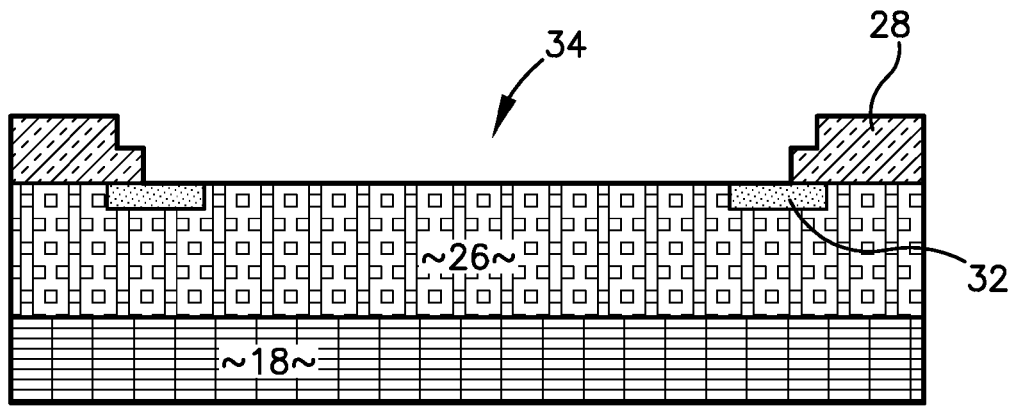
FIG. 9 is a fragmentary sectional elevation view of the device following a sixth step.

Step 6: As shown in FIG. 9, the silicon oxide 28 is etched in the center of the chip in a second photolithography step to open the active area 34.

Figure 10:
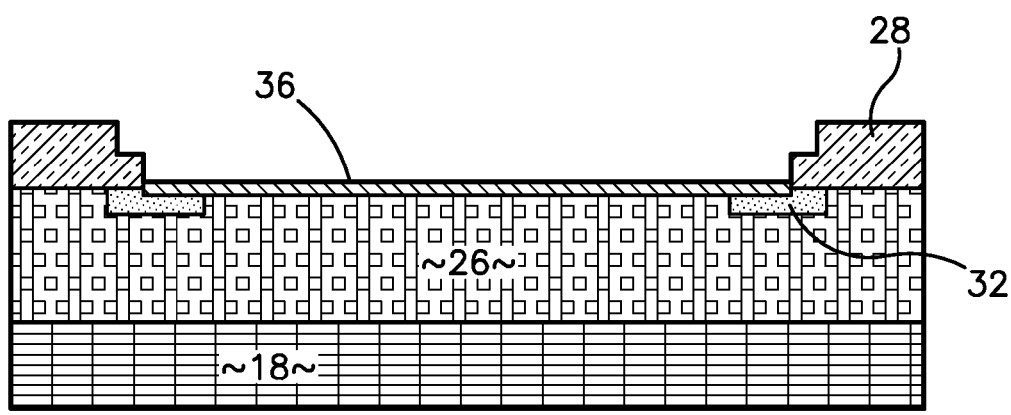
FIG. 10 is a fragmentary sectional elevation view of the device following a seventh step.

Step 7: As shown in FIG. 10, a gate oxide 36 is grown within the active area 34. In one embodiment, the gate oxide 36 has a thickness of approximately 85 Å.

Figure 11:
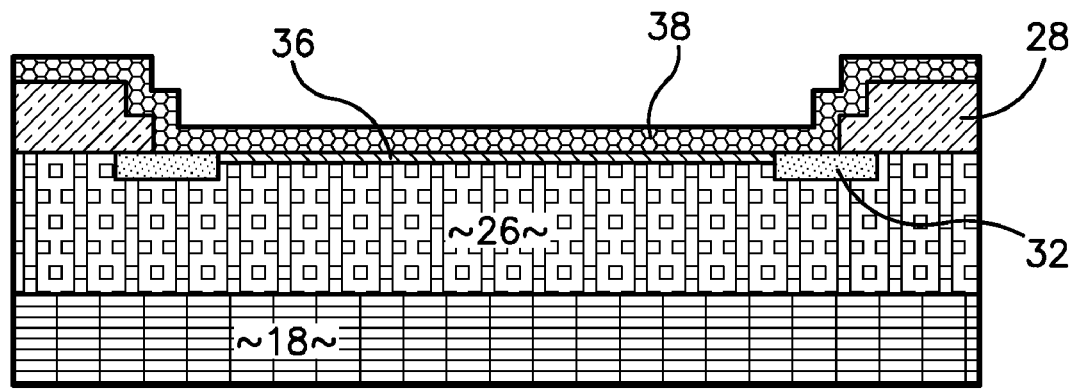
FIG. 11 is a fragmentary sectional elevation view of the device following an eighth step.

Step 8: As shown in FIG. 11, polysilicon is deposited to create a polysilicon layer 38. In one embodiment, the polysilicon layer 38 has a thickness of 1500 Å.

Step 9: The polysilicon layer 38 is implanted with arsenic. In one embodiment, the dose for the arsenic implant is approximately 8e15 cm-2 and the energy is approximately 40 keV.

Figure 12:
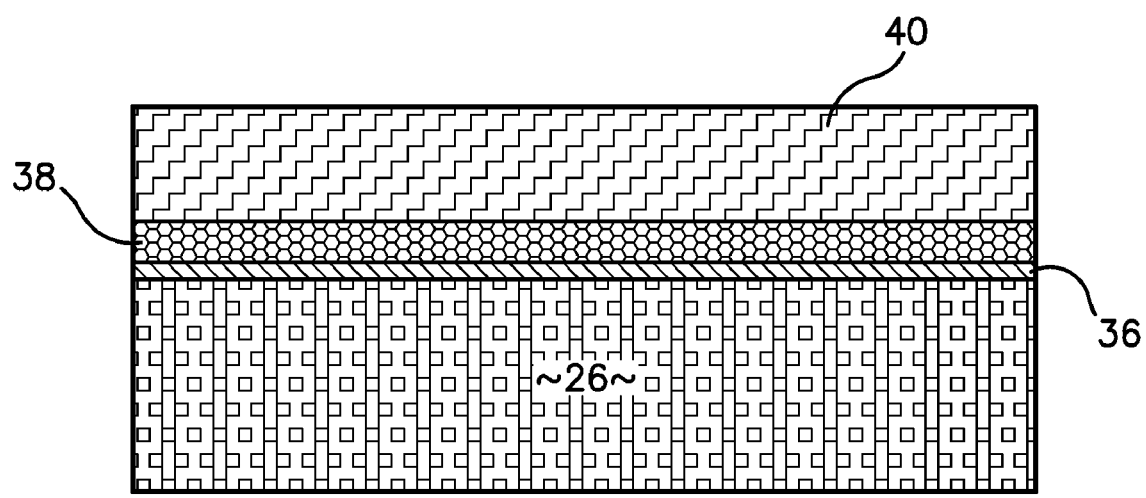
FIG. 12 is a fragmentary sectional elevation view of the device following a tenth step.

Step 10: As shown in FIG. 12, the polysilicon layer 38 is partially oxidized, leaving approximately 800 Å of the polysilicon non-oxidized, and creating a highly N-doped polysilicon gate 40.

Figure 13:
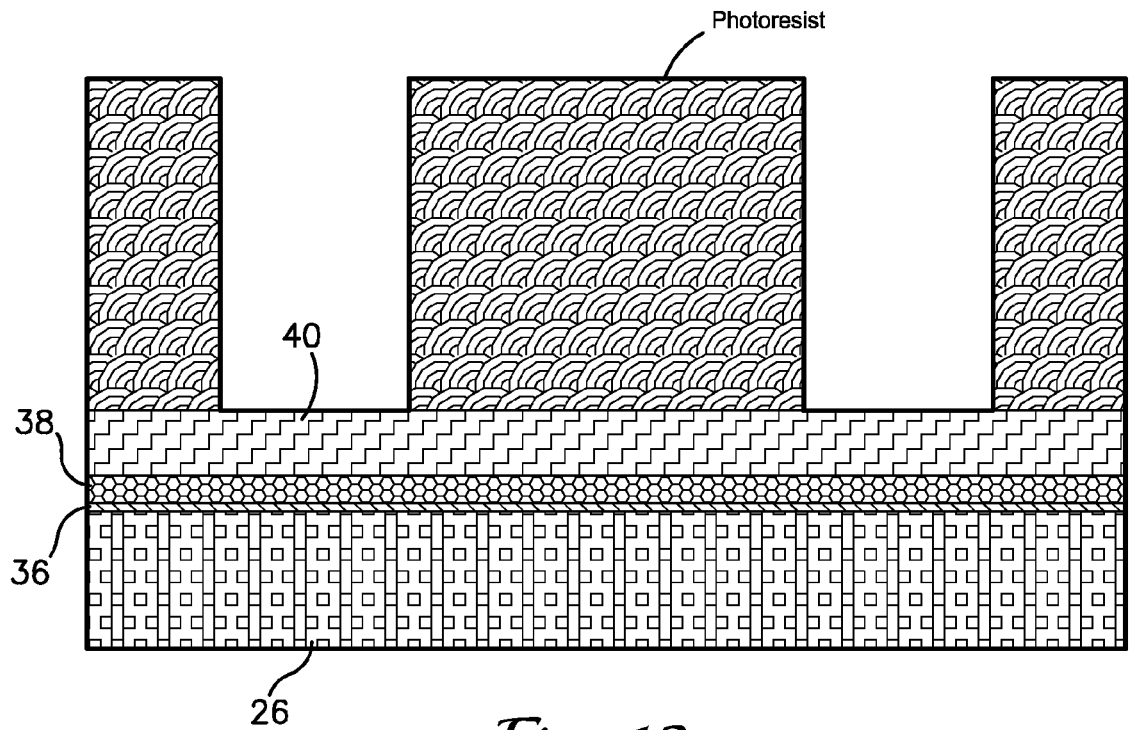
FIG. 13 is a fragmentary sectional elevation view of the device following an eleventh step.

Step 11: As shown in FIG. 13, the gate is etched, i.e., further defined, in a third photolithography step.

Figure 14:
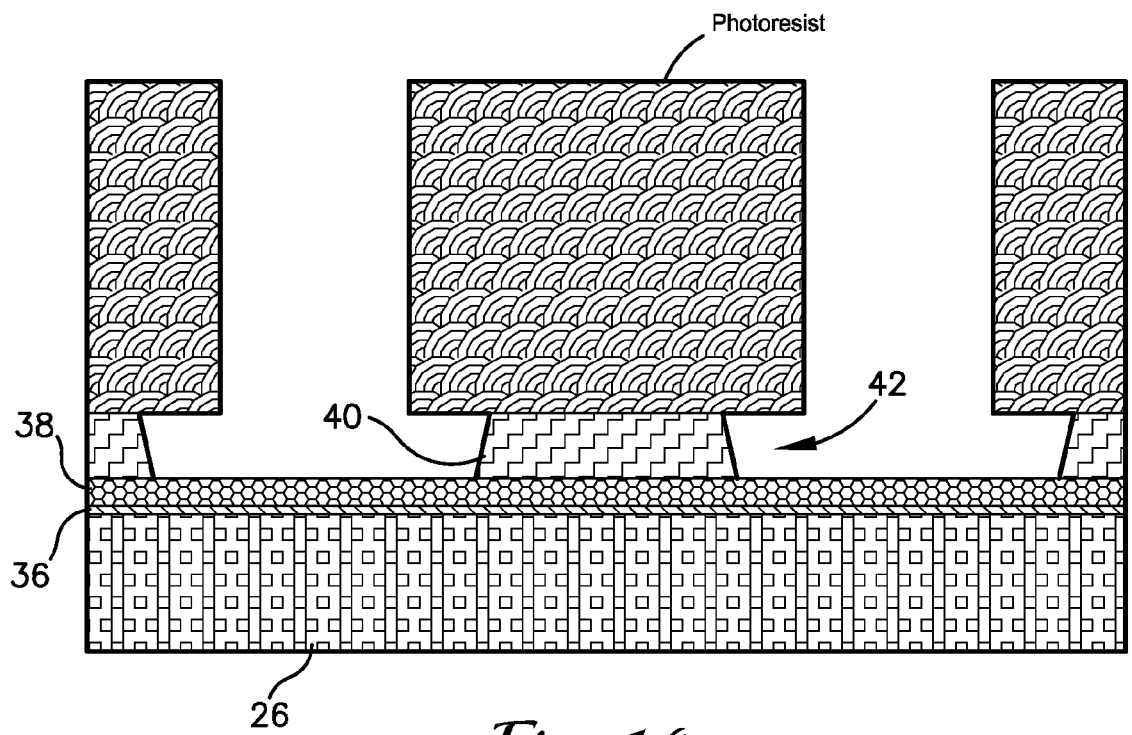
FIG. 14 is a fragmentary sectional elevation view of the device following a twelfth step.

Step 12: As shown in FIG. 14, the silicon oxide 40 is wet-etched to create an undercut area 42. The amount of undercut defines the length of the channel. In one embodiment, this step and the resulting undercut are eliminated.

Figure 15:
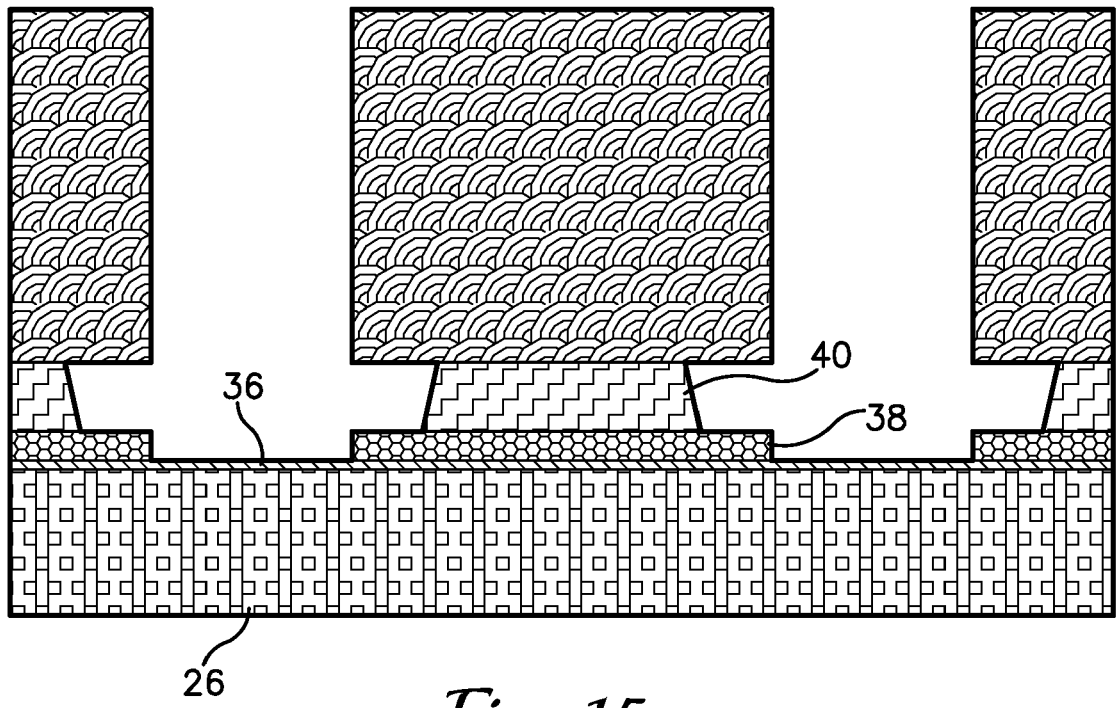
FIG. 15 is a fragmentary sectional elevation view of the device following a thirteenth step.

Step 13: As shown in FIG. 15, the polysilicon layer 38 is etched. In one embodiment, the etching is accomplished using a Reactive Ion Etching process.

Figure 16:
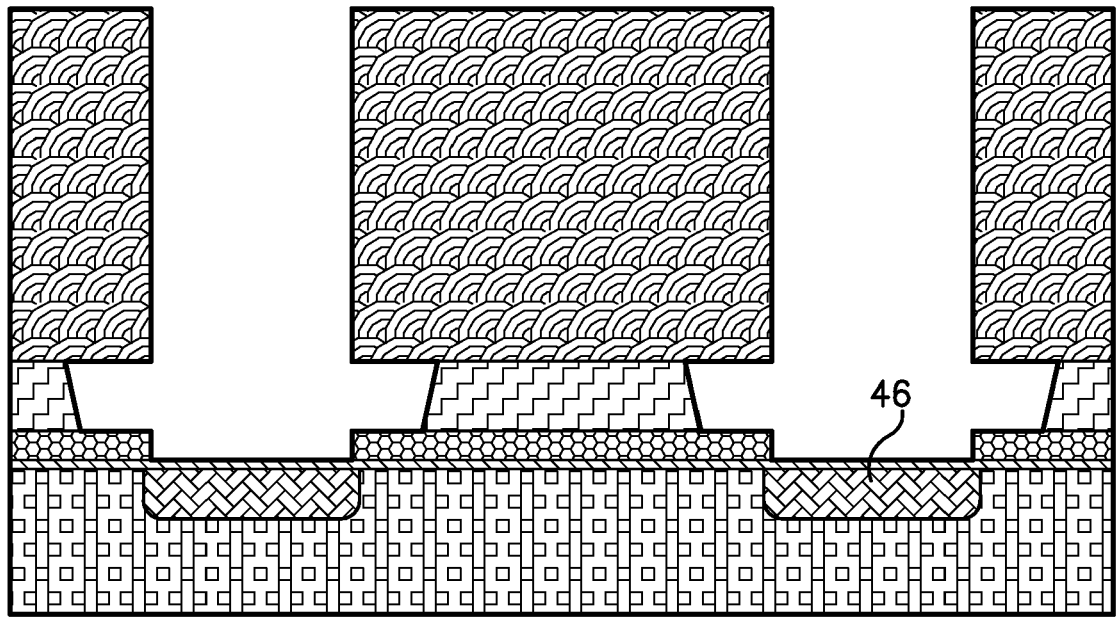
FIG. 16 is a fragmentary sectional elevation view of the device following a fourteenth step.

Step 14: As shown in FIG. 16, boron is implanted into the N-drift region to create a boron implanted region 46 which will be the P-body 14. In one embodiment, the dose for the boron implant is approximately 3e13 cm-2 and the energy is approximately 80 keV.

Figure 17:
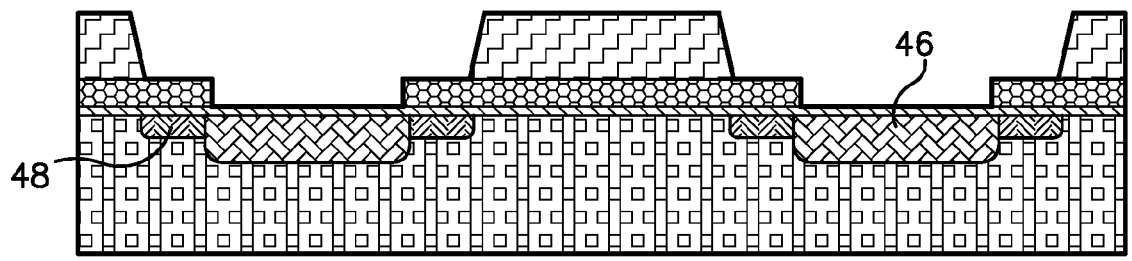
FIG. 17 is a fragmentary sectional elevation view of the device following a fifteenth step.

Step 15: As shown in FIG. 17, boron is implanted into the channel area 48 adjacent to the P-body 14 created in Step 14. In one embodiment, this step and the resulting additional boron implant is eliminated.

Figure 18:
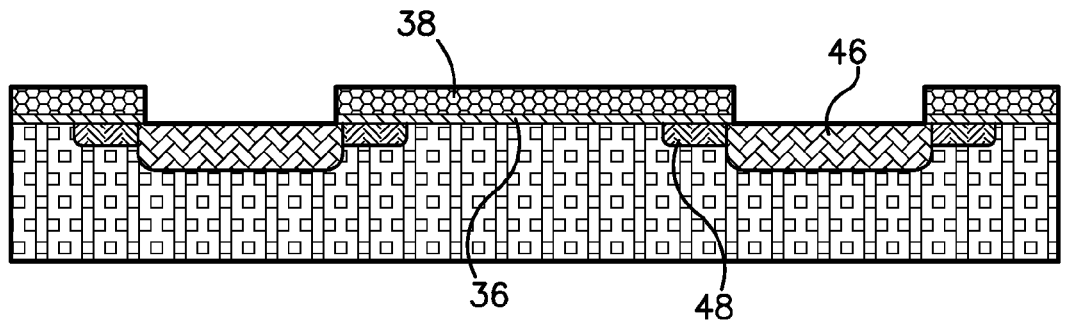
FIG. 18 is a fragmentary sectional elevation view of the device following a sixteenth step.

Step 16: As shown in FIG. 18, the top silicon oxide 38 and the gate oxide 36 outside of the polysilicon area are etched to assure good contact between the gate polysilicon, the P-body 14, and a titanium/titanium nitride sputtered metal system to be added in Step 17.

Figure 19:
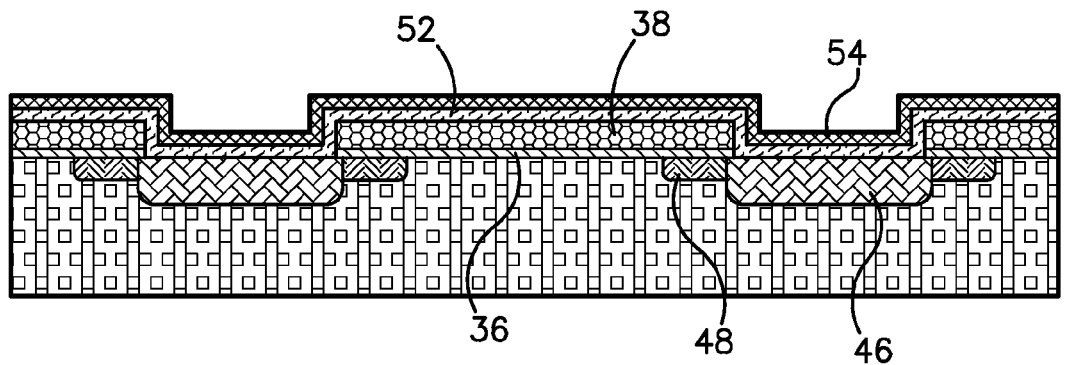
FIG. 19 is a fragmentary sectional elevation view of the device following a seventeenth step.

Step 17: As shown in FIG. 19, the titanium 52 and titanium nitride 54 is deposited using, respectively, sputtering and reactive sputtering deposition processes. In one embodiment, the titanium 52 has a thickness of 300 Å, and the titanium nitride 54 has a thickness of 500 Å.

Figure 20:
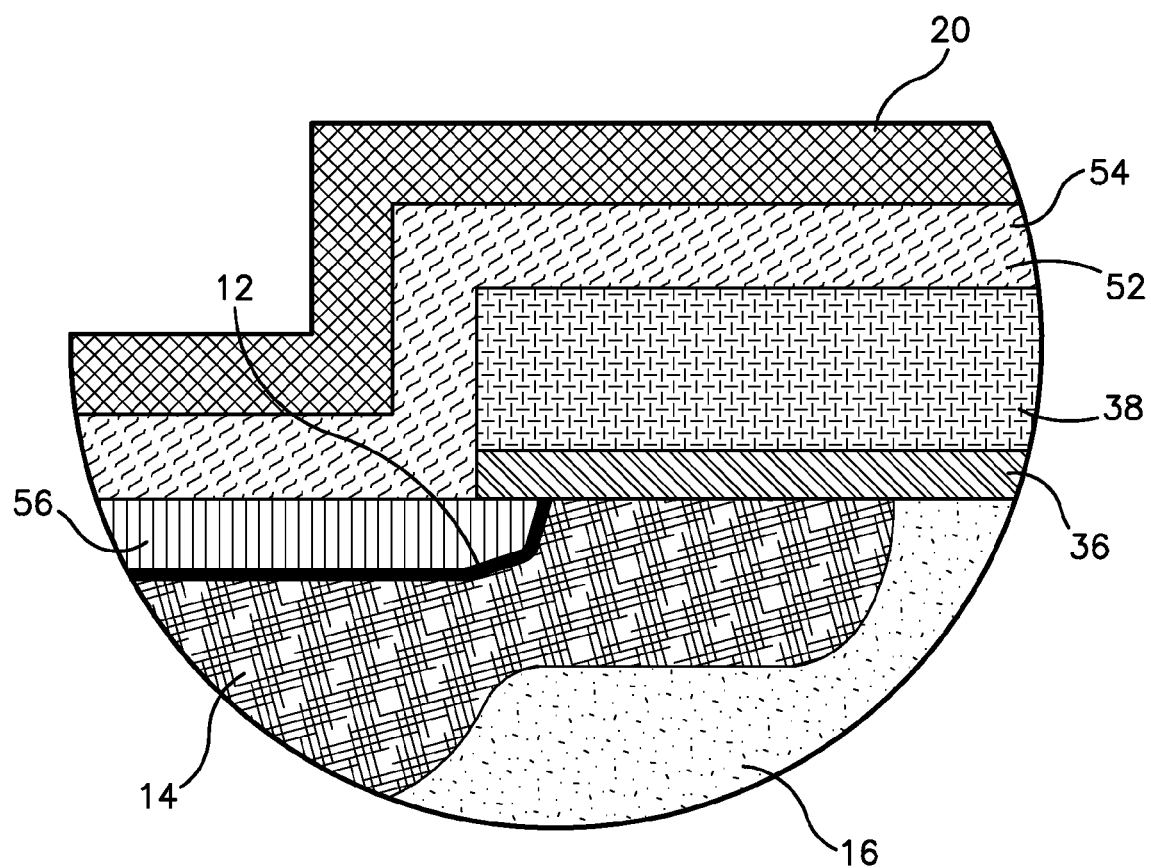
FIG. 20 is a fragmentary sectional elevation view of the device following an eighteenth step.

Step 18: Referring to FIG. 20, the layer of titanium silicide 56 is formed. An amount of silicon in the contact area is converted into the titanium silicide 56 at a temperature of 650 degrees C. or higher. Boron in the contact area is moved, or "snowplowed", to an interface region between the titanium silicide and silicon, creating the δP++ layer 12 of supersaturated P-doped silicon having a thickness of approximately several atomic layers.

Other methods of creating a supersaturated δP++ layer include molecular beam epitaxy (MBE) and atomic layer deposition (ALD), but these methods are expensive and complex. The method of the present invention uses formation of a higher order silicide, e.g., titanium silicide. Boron atoms are swept, or snowplowed, by the advancing silicide phase to the silicide/silicon interface, and, if the process of silicide formation is performed in a non-oxidizing atmosphere, such as a nitrogen atmosphere, with well-controlled temperature, the swept boron atoms will remain within the interface region. This is because the silicide forms in less than one minute and the temperature is low enough to prevent the boron atoms from being diffused into the silicon lattice deep enough to prevent the δP++ layer being formed.

Step 19: The anode 20, or top metal, is deposited, such as through a sputtering deposition process. The type of metal will depend on the type of electrode contact to be used. In one embodiment involving a wire bonded contact, the top metal is aluminum. In another embodiment involving a soldered contact, the top metal may be gold or silver.

Step 20: The anode is etched to define its pattern in a fourth photolithography step.

Step 21: As desired, the wafer is thinned. Typically, an amount of silicon is removed from the cathode, or back side, of the wafer to reduce the thickness of the final chip.

Step 22: The cathode 22, or back metal, is deposited on the cathode side of the wafer. The metal system used will depend on the type of cathode contact, e.g., solder or eutectic.

From the foregoing discussion, it will be appreciated that the device of the present invention provides significant advantages over the prior art, including a favorable balance between forward voltage drop and reverse leakage current, fast switching capability, and favorable dV/dt performance. This improvement is achieved at least in part by eliminating the parasitic N+/P/N transistor present in prior art devices. Furthermore, only four photo steps are required to produce the device, which is less than the five required for some prior art devices. Further reduction from four steps to three is possible for low breakdown voltages of 40V or less by eliminating the P+ guard ring. Additionally, the process for producing the device is significantly simplified in that neither an N+ source nor a heavy P-body has to be implanted. This allows for reducing the channel density and other geometry of the cell, resulting in a reduction in the size of the chip. Reducing the size of the chip results in a reduced footprint for the modern power rectifier device and also reduced cost.

Although the invention has been disclosed with reference to various particular embodiments, it is understood that equivalents may be employed and substitutions made herein without departing from the scope of the invention as recited in the claims.

Having thus described a preferred embodiment of the invention, what is claimed as new and desired to be protected by Letters Patent includes the following:

1. A two-terminal semiconductor rectifier device comprising:
    a δP++ layer;
    a P-body located substantially below and adjacent to the δP++ layer;
    an N-drift region located substantially below and adjacent to the P-body region;
    an N+ substrate located substantially below the N-drift region;
    a region of higher-order silicide located substantially above and adjacent to the δP++ layer;
    a layer of oxide functioning as a gate dielectric located substantially above and adjacent to one or more of the N-drift region, the P-body, the δP++ layer, and the region of titanium silicide;
    a layer of polysilicon located substantially above and adjacent to the layer of oxide; and
    a layer of titanium located substantially above and adjacent to the layer of polysilicon.

2. The semiconductor rectifier device as set forth in claim 1, wherein the titanium has a thickness of approximately 300 Å.

3. The semiconductor rectifier device as set forth in claim 1, further including a layer of titanium nitride located substantially above and adjacent to the layer of titanium.

4. The semiconductor rectifier device as set forth in claim 2, wherein the layer of titanium nitride has a thickness of approximately 500 Å.

* * * * *